United States Patent
Gorlow et al.

(10) Patent No.: US 12,191,834 B2
(45) Date of Patent: Jan. 7, 2025

(54) METHOD AND UNIT FOR PERFORMING DYNAMIC RANGE CONTROL

(71) Applicant: DOLBY INTERNATIONAL AB, Dublin (IE)

(72) Inventors: Stanislaw Gorlow, Stockholm (SE); Robin Thesing, Nuremberg (DE)

(73) Assignee: DOLBY INTERNATIONAL AB, Dublin (IE)

( * ) Notice: Subject to any disclaimer, the term of this patent is extended or adjusted under 35 U.S.C. 154(b) by 204 days.

(21) Appl. No.: 17/921,279

(22) PCT Filed: May 17, 2021

(86) PCT No.: PCT/EP2021/062942
§ 371 (c)(1),
(2) Date: Oct. 25, 2022

(87) PCT Pub. No.: WO2021/233809
PCT Pub. Date: Nov. 25, 2021

(65) Prior Publication Data
US 2023/0198488 A1    Jun. 22, 2023

Related U.S. Application Data

(60) Provisional application No. 63/027,517, filed on May 20, 2020.

(30) Foreign Application Priority Data

May 20, 2020 (EP) ..................... 20175651

(51) Int. Cl.
*H03G 9/02* (2006.01)
*H03G 7/00* (2006.01)

(52) U.S. Cl.
CPC ............. *H03G 9/025* (2013.01); *H03G 7/007* (2013.01)

(58) Field of Classification Search
CPC .............................. H03G 9/025; H03G 7/007
USPC ......................................... 381/106, 104, 102
See application file for complete search history.

(56) References Cited

U.S. PATENT DOCUMENTS

| | | |
|---|---|---|
| 6,959,220 B1 | 10/2005 | Wiser |
| 7,403,627 B2 | 7/2008 | Wu |
| 8,626,516 B2 | 1/2014 | Zeng |
| 8,938,313 B2 | 1/2015 | Dickins |
| 9,076,437 B2 | 7/2015 | Niemisto |
| 9,369,798 B1 | 6/2016 | Alderson |
| 9,635,459 B2 | 4/2017 | Jung |

(Continued)

OTHER PUBLICATIONS

ETSI TS 103 190-1 V1.3.1, "Digital Audio Compression (AC-4) Standard; Part 1: Channel Based Coding" Feb. 2018.

(Continued)

*Primary Examiner* — Thjuan K Addy

(57) ABSTRACT

A dynamic range control unit (210) configured to apply dynamic range control, referred to as DRC, to an audio signal (211). The DRC unit (210) is configured to downsample a subband signal (212) derived from the audio signal (211), to provide a downsampled subband signal (321), to determine a DRC gain (329) based on the downsampled subband signal (321), and to apply the DRC gain (329) to the subband signal (212), to provide a compressed subband signal (213) of a compressed audio signal (214).

20 Claims, 3 Drawing Sheets

(56) References Cited

U.S. PATENT DOCUMENTS

| | | |
|---|---|---|
| 2007/0078645 A1 | 4/2007 | Niemisto |
| 2008/0004735 A1 | 1/2008 | Michener |
| 2014/0039890 A1 | 2/2014 | Mundt |
| 2016/0163305 A1 | 6/2016 | Lee |
| 2016/0322949 A1 | 11/2016 | Gautama |
| 2017/0229134 A1 | 8/2017 | Baumgarte |
| 2017/0249950 A1 | 8/2017 | Hoerich |
| 2018/0350405 A1* | 12/2018 | Marco .................. G11B 27/031 |

OTHER PUBLICATIONS

ISO/IEC 23003-4 "Information Technology—MPEG Audio Technologies" Part 4:Dynamic Range Control, Nov. 15, 2015.
ISO/IEC JTC 1/SC 29 N Information Technology—MPEG Audio Technologies—Part 4: Dynamic Range Control, Amendment 1: Parametric DRC, Jun. 26, 2015.

* cited by examiner

METHOD AND UNIT FOR PERFORMING DYNAMIC RANGE CONTROL

CROSS-REFERENCE TO RELATED APPLICATION

This application is a U.S. National Stage application under U.S.C. 371 of International Application No. PCT/EP2021/062942, filed May 17, 2021, which claims priority of the following priority applications: U.S. provisional application 63/027,517 (reference: D17089USP1), filed 20 May 2020 and EP application No. 20175651.7 (reference: D17089EP), filed 20 May 2020, each of which are hereby incorporated by reference.

TECHNICAL FIELD

The present document relates to a method and a corresponding device or unit for applying dynamic range control (DRC) to an audio signal, notably to a multi-channel audio signal.

BACKGROUND

Dynamic range control or dynamic range compression (DRC) may be used in various applications, e.g. to allow audio content to be rendered at a high perceptual quality in noisy environments. In particular, an audio signal is to be modified in such a way that the (compressed) audio signal is robust to surrounding noise (and by consequence intelligible and/or audible). DRC may achieve this by densifying the audio signal in terms of dynamics. DRC may be applied such that the average power of the audio signal increases and that the peak level of the audio signal does not increase. By doing this, an increased signal-to-noise ratio (SNR) may be achieved.

The application of DRC to a multi-channel audio signal may be associated high computational complexity. Furthermore, the application of DRC to an audio signal may lead to audible artifacts which may be perceived as unpleasant by an average group of listeners.

The present document addresses the technical problem of enabling DRC at relatively low computational complexity and/or at relatively high perceptual quality, notably in the context of a multi-channel and/or multi-object coding system such as the Dolby AC-4 coding system.

SUMMARY

According to an aspect, a dynamic range control unit configured to apply dynamic range control, referred to as DRC, to an audio signal is described. The DRC unit is configured to downsample a subband signal derived from the audio signal, to provide a downsampled subband signal. Furthermore, the DRC unit is configured to determine a DRC gain based on the downsampled subband signal and to apply the DRC gain to the subband signal (i.e. before it was downsampled), to provide a compressed subband signal of a compressed audio signal.

It is noted that the downsampling of the subband signal is performed after the conversion to subband domain (e.g. QMF filterbank processing). The downsampling of the present invention is thus done in addition to any downsampling which is inherent in the subband domain conversion. Such downsampling inherently included in the subband doman conversion is discussed e.g. in US 2007/0078645, where it is implemented inherently in a filterbank which converts a time-domain signal into decimated subband signals.

Further, it is noted that according to the invention, it is only the determination of the DRC gains which is performed on the downsampled subband signal. The DRC gains are then applied to the subband signal output from the subband domain conversion, rather than the additionally downsampled version thereof. This is fundamentally different from prior art solutions such as US 2007/0078645, where the downsampled subband signals are used for all downstream audio processing.

According to a further aspect, a decoding unit is described, wherein the decoding unit is configured to derive a dynamic-range compressed audio signal from a bitstream which is indicative of an audio signal. The decoding unit comprises the DRC unit described herein.

According to another aspect, a method for applying dynamic range control, referred to as DRC, to an audio signal is described. The method comprises downsampling a subband signal derived from the audio signal, to provide a downsampled subband signal.

Furthermore, the method comprises determining a DRC gain based on the downsampled subband signal, and applying the DRC gain to the subband signal, to provide a compressed subband signal of a compressed audio signal.

According to a further aspect, a software program is described. The software program may be adapted for execution on a processor and for performing the method steps outlined in the present document when carried out by the processor.

According to another aspect, a storage medium is described. The storage medium may comprise a software program adapted for execution on a processor and for performing the method steps outlined in the present document when carried out by the processor.

According to a further aspect, a computer program product is described. The computer program may comprise executable instructions for performing the method steps outlined in the present document when executed on a computer.

It should be noted that the methods and systems including its preferred embodiments as outlined in the present patent application may be used stand-alone or in combination with the other methods and systems disclosed in this document. Furthermore, all aspects of the methods and systems outlined in the present patent application may be arbitrarily combined. In particular, the features of the claims may be combined with one another in an arbitrary manner.

SHORT DESCRIPTION OF THE FIGURES

The invention is explained below in an exemplary manner with reference to the accompanying drawings, wherein FIG. 1 shows a block diagram of an example coding system;

DETAILED DESCRIPTION

Figure 1:
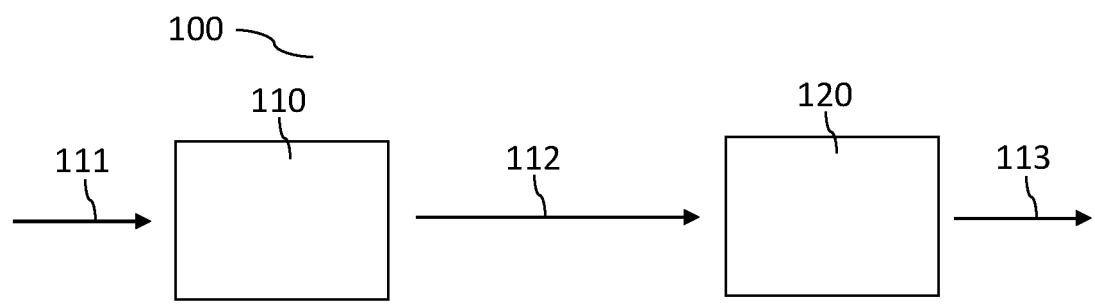

As outlined above, the present document addresses the technical problem of enabling dynamic range control at low computational complexity and/or at a high perceptual quality. In this context, FIG. 1 shows a block diagram of an example audio coding system (also referred to as a codec) 100 comprising a coding unit 110 (also referred to as an encoder) and a corresponding decoding unit 120 (also referred to as a decoder). The coding unit 110 is configured to generate a bitstream 112 for a (multi-channel) audio signal 111, wherein the bitstream 112 is indicative of coded audio data and metadata for the audio signal 111. The decoding unit 120 is configured to generate a reconstructed (multi-channel) audio signal 113 based on the bitstream 112. The decoding unit 120 may comprise the DRC unit which is described in the present document.

To enable a decoding unit 120 to perform DRC on the reconstructed audio signal 113, the coding unit 110 may be configured to provide DRC profile data (also referred to as DRC metadata) as part of the bitstream 112 that can be used by the decoding unit 120 to perform DRC. In particular, the profile data may be used by the coding unit 110 to steer or control the DRC in the decoding unit 120 (notably in a DRC unit of the decoding unit 120). Hence, the profile data may comprise control data for performing DRC in the decoding unit 120. The profile data may be indicative of the compression curve to be used for DRC.

DRC may be performed in the subband domain (also referred to as the transform domain). For this purpose, the audio signal 111 may be transformed or converted from time domain to subband domain using a forward transform or an analysis filter bank, such as an analysis (pseudo-) quadrature mirror filter (QMF) bank. Subsequent to performing DRC in the subband domain, the dynamic-range compressed subband signals may be transformed or converted back from the subband domain to the time domain using an inverse transform or a synthesis filter bank, such as a synthesis QMF bank.

Figure 2:
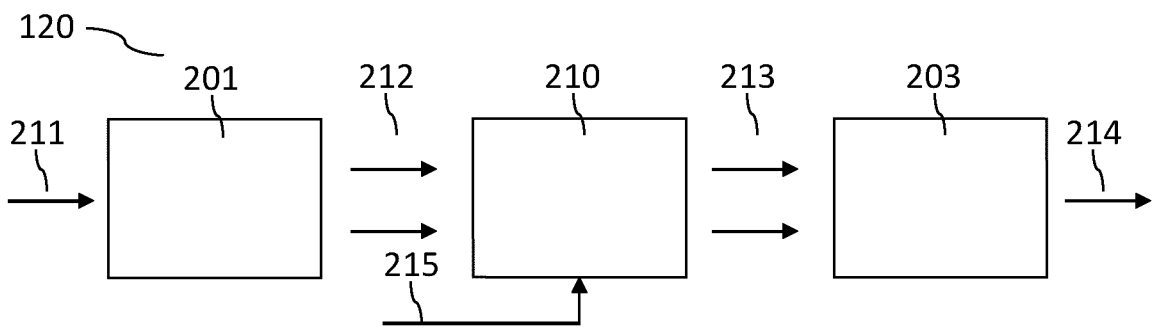
FIG. 2 illustrates an example scheme for applying DRC in the subband domain.

FIG. 2 illustrates an example scheme for performing DRC in the subband domain. An audio signal 211 (e.g. the audio signal 111 of FIG. 1) may be transformed or converted from time domain to subband domain using a forward transform or an analysis filter bank 201 (e.g. an analysis pseudo-QMF bank). As a result of the forward transform or the analysis, a plurality of subband signals 212 for a corresponding plurality of subbands or frequency bins is obtained. By way of example, K subband signals 212 may be obtained, e.g. K=64.

DRC may be applied to the different subband signals 212 in the DRC unit 210, wherein the DRC unit 210 may take into account profile data 215 (which may be provided by the coding unit 110 in the bitstream 112). As indicated above, the profile data 215 may also be referred to as DRC metadata.

The DRC unit 210 may generate a plurality of (dynamic-range) compressed subband signals 213 (notably K compressed subband signals 213) from the corresponding plurality of subband signals 212, respectively. The compressed subband signals 213 may be transformed or converted to the time domain using an inverse transform or a synthesis filter bank 203 (e.g. a synthesis pseudo-QMF bank), thereby providing a (dynamic-range) compressed audio signal 214. It should be noted that in the present document, the term "compressed" refers to dynamic range compression (and not to data compression).

In the following, an example DRC scheme is described for a pseudo-QMF bank with K=64 subband signals 212. It should be noted that the aspects which are described below are applicable to other time-domain/frequency- or subband-domain transforms or other analysis/synthesis filter banks in an analogous manner.

The input data 212 that is fed to the DRC unit 210 may be organized as a K×N matrix, wherein K stands for the number of subbands and N is the number of time slots (e.g. N=32) that are processed jointly. The N subband samples 212 corresponding to the N time slots may be referred to as a block or a frame. The output data 213 from the DRC unit 210 typically has the same dimensionality as the input data 212.

The DRC unit 210 may operate in Q DRC bands (e.g. Q=4), each of which covers one or more subbands or frequency bins. Hence, the K subbands may be grouped into Q frequency bands. Various groupings of subbands or frequency bins may be used. By way of example, the following nonuniform subband grouping (also referred to as banding) may be used:
Q=4 frequency bands; with
start_bands=[1, 2, 4, 19, $K_{max}$+1].

In other words, the first band may comprise the frequency bin k=1, the second band may comprise frequency bins k=2, 3, the third band may comprise frequency bins k=4, 5, . . . , 18, and the fourth band may comprise frequency bins k=19, 20, . . . , $K_{max}$. In order to reduce computational complexity, only $K_{max}$ of the K subband signals 212, with $K_{max}$<K, may be taken into account, when calculating the DRC gains for performing DRC.

Figure 3:
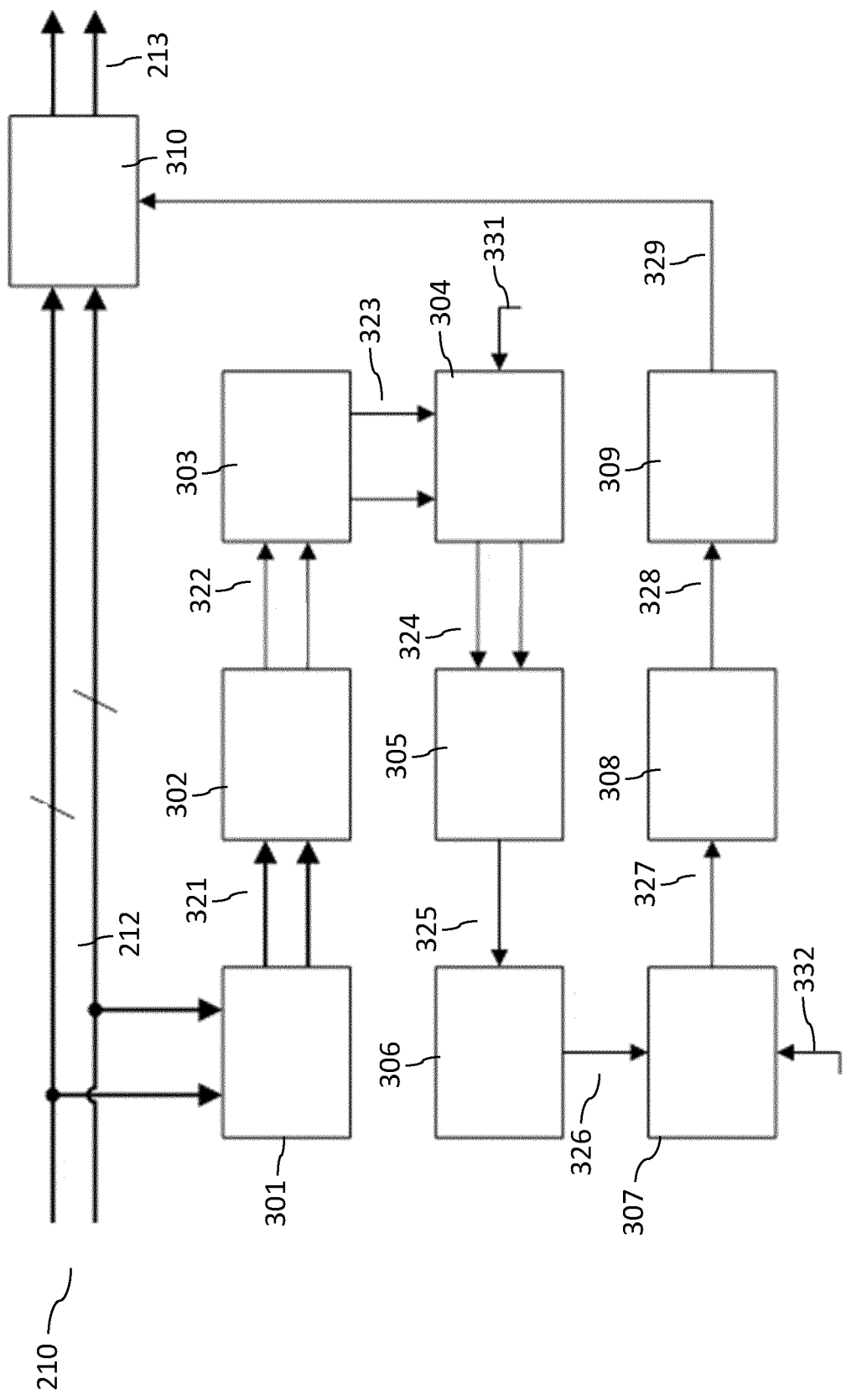
FIG. 3 shows a block diagram of an example DRC unit.

FIG. 3 shows a block diagram of an example DRC unit 210. Each of the subunits are described in the following. The DRC unit 210 may comprise an arbitrary subset of the subunits which are described in the context of FIG. 3.

The DRC unit 201 may comprise a downsampling unit 301 which is configured to generate $K_{max}$ downsampled subband signals 321 from the $K_{max}$ subband signals 212. In particular, the temporal resolution of the subband signals 212 may be reduced by a downsampling factor M, M∈ℕ. The gain computation may thus be performed on a $K_{max}$× N/M input data matrix (for each channel of a multi-channel audio signal 211, e.g. for two channels in case of a stereo signal 211, thereby yielding an input data tensor). Hence, the dimensionality of the input data for calculating one or more DRC gains may be reduced by a downsampling factor of M.

It is noted that the downsampling by a factor M discussed above is separate from any downsampling which may be inherent in the conversion to the subband domain. For example, a QMF filterbank may be configured to provide downsampling of the subband signals. The downsampling in the downsampling unit 301 is done in addition to any such downsampling.

In a preferred example, the downsampling factor M is selected such that N is an integer multiple of M, in order to allow for uniform sampling. Moreover, taking the temporal resolution of human hearing into account, i.e. assuming that the new sampling period is smaller than (or equal to) the integration time of the human ear, downsampling may be performed without the use of a lowpass filter, thereby further reducing the computational complexity. Hence, downsampling of a subband signal 212 by a downsampling factor M may be performed in an efficient manner by retaining only every $M^{th}$ sample or time slot of the subband signal 212.

In view of the fact that the use of a complex pseudo-QMF bank leads to an oversampling by a factor of 2, downsampling by a factor M=2 typically has no perceptual impact on the quality after applying DRC.

As a result of downsampling the subband signals 212 by the downsampling factor M, the $K_{max}$ downsampled subband signals 321 exhibit a number of time slots, which is a factor of M smaller than the number of time slots of the corresponding subband signals 212. The time slots of the downsampled subband signals 321 may be identified using the index n.

The loudness unit 302 may be configured to determine loudness values or loudness estimates 322 (in the linear domain) for each subband group (or DRC band) i=1, 2, . . . , Q, for each time slot n=1, 2, . . . , N/M, and possibly for each channel l=1, 2, . . . , L (e.g. L=2) of the (multichannel) audio signal 211.

For DRC band i and for time slot n, the loudness computation may be as follows. First, the in-band power $P_{inl}$ per channel l, e.g. l∈{1, 2}, may be determined according to $$P_{inl} = \sum_{k=start\_band_i}^{start\_band_{i+1}-1} \Re^2(x_{knl}) + \Im^2(x_{knl}),$$

wherein $start\_band_i$ is the first (lowest) frequency bin in the $i^{th}$ DRC band and wherein $start\_band_{i+1}-1$ is the last (highest) frequency bin in the $i^{th}$ DRC band. $\Re(x_{knl})$ is the real part and $\Im(x_{knl})$ is the imaginary part of the sample $x_{knl}$ (for time slot n, frequency bin k, and channel l).

Subsequently, the in-band power values $P_{inl}$ may be converted to (in-band) magnitude values by applying the square root to the in-band power $P_{inl}$ $$l_{inl}=\sqrt{P_{inl}}.$$

Finally, Steven's power law may be applied using the exponent for loudness (α=0.67) to determine a loudness value or loudness estimate $L_{inl}$ 322 (for DRC band i, time slot n and channel l)

$$L_{inl}=l_{inl}^{0.67}.$$

In this way, Q×L loudness values or loudness estimates $L_{inl}$ 322 (in the linear domain) are obtained at each time instant or time slot n, one for each of the DRC bands i, i=1, 2, . . . , Q, and for each of the channels l, l=1, 2, . . . , L.

The linear-to-log converter unit 303 may be configured to convert the loudness values $L_{inl}$ 322 from the linear domain to the log-domain. DRC typically makes use of a static compression curve, which is part of the DRC profile. As the compression curve is typically defined in the log-domain, the loudness values 322 in the linear domain may be converted to decibels using $$L_{inl}^{dB}=20 \log_{10} L_{inl},$$

thereby providing the logarithmic loudness values or loudness estimates $L_{inl}^{dB}$ 323.

The loudness-to-gain mapping unit 304 may be configured to derive a gain value 324 (referred to herein as the mapped gain value) based on a corresponding loudness value or loudness estimate $L_{inl}^{dB}$ 323. For this purpose, a compression curve may be used. The parametrization of the compression curve may e.g. be defined in the ETSI standard ETSI TS 103 190 (notably for DRC in AC-4). This document is incorporated herein by reference in its entirety.

The compression curve may be a piecewise linear function in the log-domain comprising at least some of the following seven subfunctions:

$$F(L) = \begin{cases} G_{maxboost} & \text{if } L < L_{maxboost}, \\ G_{sectionboost} + \dfrac{(G_{maxboost} - G_{sectionboost}) \cdot (L_{sectionboost} - L)}{L_{sectionboost} - L_{maxboost}} & \text{if } L_{maxboost} \leq L < L_{sectionboost}, \\ G_{sectionboost} \cdot \dfrac{L_{0low} - L}{L_{0low} - L_{sectionboost}} & \text{if } L_{sectionboost} \leq L < L_{0low}, \\ 0 & \text{if } L_{0low} \leq L < L_{0high}, \\ G_{sectioncut} \cdot \dfrac{L - L_{0high}}{L_{sectioncut} - L_{0high}} & \text{if } L_{0hgih} \leq L < L_{sectioncut}, \\ G_{sectioncut} + \dfrac{(G_{maxcut} - G_{sectioncut}) \cdot (L - L_{sectioncut})}{L_{maxcut} - L_{sectioncut}} & \text{if } L_{sectioncut} \leq L < L_{maxcut}, \\ G_{maxcut} & \text{if } L \geq L_{maxcut} \end{cases}$$

The parameters of the compression curve F(L) may be provided as profile data 215. Example parameters are the different (linear) gain values $G_{maxcut}$, $G_{sectioncut}$, $G_{sectionboost}$, and/or $G_{maxboost}$ for different loudness intervals.

Further example parameters are thresholds for defining the different segments of the compression curve $L_{maxcut}$, for defining the loudness value or loudness estimate, starting from which maximum downward compression is performed (using the gain value $G_{maxcut}$);

$L_{sectioncut}$ and $L_{0high}$, for defining the one or more loudness values or loudness estimates, starting from which intermediate downward compression is performed;

$L_{0low}$ and $L_{0high}$, for defining an interval of loudness values or loudness estimates, for which no compression is performed;

$L_{sectionboost}$ and $L_{0low}$, for defining the one or more loudness values or loudness estimates, starting from which intermediate upward compression is performed; and/or $L_{maxboost}$, for defining the loudness value or loudness estimate, starting from which maximum upward compression is performed (using the gain value $G_{maxboost}$)

The compression curve F(L) is configured to map loudness values or loudness estimates L 323 to the corresponding (mapped) gain values 324. A (mapped) gain value 324 may be determined for each time slot n, for each DRC band i and/or for each channel l.

The piecewise-defined function F(L) comprises a boost segment (upward compression or "expansion") and a cut segment (downward compression or simply "compression"), which are centered around a reference value. The reference value may correspond to the average dialog level, alias dialnorm, within the audio signal 211. In the above-mentioned formula, a reference value of 0 dB has been assumed. Alternatively, a reference value according to the dialnorm value (which may be indicated in the bitstream 112) may be used.

The operating point $O_{inl}$ of the compression curve F(L) may be determined by the loudness deviation ΔL of an instantaneous broadband loudness level from a reference level (e.g. from the dialnorm value). Accordingly, the (mapped) gain values $F_{inl}$ 334 for each of the DRC bands i (for each time slot n and/or channel l) may be given by $$F_{inl}=F(L_{inl}^{dB}-O_{inl}),$$

wherein $O_{inl}$ is the operating point 331 of the compression curve, which depends on the loudness deviation ΔL. $L_{inl}^{dB}$ is the above-mentioned in-band loudness value or loudness estimate 323 in the log-domain. Details regarding a preferred way for computing the deviation ΔL and the operating point $O_{inl}$ are given further down.

The stereo or multi-channel linking unit 305 may be configured to determine a single gain value 325 for a subgroup or all channels of the audio signal 211. Typically, it is desired to preserve the multi-channel, notably the stereo, image of an audio signal 211. This may be achieved by applying the same gain value to all channels l, l=1, 2, . . . , L, of the audio signal 211. In particular, the smallest gain value, i.e. the greatest attenuation in the case of compression and the smallest amplification in the case of expansion, for all channels l, l=1, 2, . . . , L, of the audio signal 211 may be selected as the common gain value 325. Hence, the gain value 325 may be selected as $$F_{in} = \min(F_{in1}, F_{in2}),$$

in the case of a two-channel audio signal 211. This principle can be extended to a larger number of channels, L.

The gain smoothing unit 306 may be configured to smoothen the (mapped) gain value 324, 325 over time. In particular, exponential smoothing may be applied to the (mapped) gain value 324, 325 at successive time instants, to avoid abrupt changes in the output signal due to compression or expansion. The smoothed gain $G_{in}$ 326 may be determined as $$G_{in} = \alpha F_{in} + (1-\alpha) \cdot G_{i,n-1},$$

wherein $G_{i,n-1}$ is the smoothed gain 326 at the previous time slot n−1, wherein $F_{in}$ is the (instantaneous or mapped) gain value 324, 325 calculated for the current time slot n, and where $G_{in}$ is the smoothed gain 326 at the current time slot n.

The smoothing factor α may be determined depending on whether the signal's (in-band) loudness level or loudness estimate $L_{in}^{dB}$ 323 (for one or more channels of the audio signal 211) is below or above the reference or operating point 331 and whether the loudness level or loudness estimate $L_{in}^{dB}$ 323 is rising or falling. In particular, $$\alpha = \begin{cases} \alpha_{expansion} & \text{if } L_{in}^{dB} < 0_{in}, \\ \alpha_{compression} & \text{otherwise} \end{cases},$$

where $$\alpha_{expansion} = \begin{cases} \alpha_{attack} & \text{if } F_{in} > G_{i,n-1}, \\ \alpha_{release} & \text{otherwise} \end{cases},$$

and $$\alpha_{compression} = \begin{cases} \alpha_{attack} & \text{if } F_{in} < G_{i,n-1}, \\ \alpha_{release} & \text{otherwise} \end{cases},$$

respectively. The parameters $\alpha_{attack}$ and $\alpha_{release}$ for performing gain smoothing may be provided within the profile data 215.

Furthermore, it may be distinguished between two different smoothing factors as a function of the loudness jumps (i.e. differences between the loudness estimates 323) between two consecutive time instances or time slots n. For relatively big jumps, it is typically desired that the DRC reacts more promptly. For relatively small variations, the reaction of the DRC should typically be gentle. For this purpose, two threshold values are foreseen in the above-mentioned ETSI standard: $T_{attack}$ and $T_{release}$ (which may be indicated within the profile data 215). Hence, the smoothing factor α may be determined as, $$\alpha = \begin{cases} \alpha_{attackfast} & \text{if } |F_{in} - G_{i,n-1}| > T_{attack}, \\ \alpha_{attack} & \text{otherwise} \end{cases},$$

and $$\alpha = \begin{cases} \alpha_{releasefast} & \text{if } |F_{in} - G_{i,n-1}| > T_{release}, \\ \alpha_{release} & \text{otherwise} \end{cases},$$

respectively. The relation between the smoothing factors and the corresponding time constants may be $$\alpha = 1 - \exp\left(-\frac{T_s}{\tau}\right),$$

where $T_s$ is the sampling period after downsampling and where τ is the time constant. Both $T_s$ and τ are typically expressed in milliseconds. The parameters $T_s$ and τ may be indicated within the profile data 215.

The gain makeup unit 307 may be configured to add a constant offset to the smoothed gain value 326, to provide a modified gain value 327. The metadata associated with a (AC-4) bitstream 112 may be indicative of the average dialog level (i.e. dialnorm) of the audio signal 111, 211 before applying DRC. Furthermore, the bitstream 112 may be indicative of the desired output reference level after applying DRC. The difference B between the two levels may be added to the smoothed gain 326 as a constant gain B 332, yielding the control signal or control gain 327

$$C_{in} = G_{in} + B.$$

The log-to-linear converter unit 308 may be configured to convert the control signal or control gain 327 from the log-domain to the linear domain, in order to allow the control gain 327 to be combined with the subband signals 212. This may be accomplished through the following inverse operation $$c_{in} = 10^{\frac{c_{in}}{20}},$$

thereby providing the control gain 328 in the linear domain (for time slot n and DRC band i).

The upsampling unit 309 may be configured to upsample the control gain 328 by the factor M, in order to provide an upsampled control gain 328 for each time slot of the subband signals 212. Hence, the control signal or gain 328 may be brought to the sample rate of the subband signals 212. This may be achieved in an efficient manner by separating the original samples of the control gain 328 by M−1 zeros and filling the zeros with the original samples, similar to a "sample and hold" operation:

$$C_{i,j+n \cdot M} = c_{in}, j=0,1, \ldots, M-1.$$

The gain application unit 310 may be configured to apply the (upsampled) control signal or to gains 329 to all the channels of a subband signal 212 by a multiplication operation:

$$y_{knl} = c_{in} \cdot x_{knl}, \forall k \in [\text{start\_band}_i; \text{start\_band}_{i+1}-1], l \in \{1, 2, \ldots, L\}.$$

The subband signals 212 (i.e. the samples of the different subband signals 212) of the same DRC band i may be compressed using the gain $c_{in}$ 329 for this DRC band i. As a result, compressed subband signals 213 are obtained. The compressed subband signals 213 may be transformed or converted to the time domain using a subband-domain to time-domain (inverse) transform or a synthesis filter bank (e.g. a synthesis pseudo-QMF bank), to determine the compressed audio signal 214.

It is again emphasized that the application of the control gain in unit 310 is made to the subband signals output from the subband domain conversion, rather than the downsampled versions thereof. The downsampling in unit 301 thus only has a computational impact on the determination of DRC gains, not on their application.

As indicated above, the operating point $O_{in}$ 331 of the compression curve F(L) may be determined individually for each DRC band i and time slot n. The operating point 331 may be determined based on an estimate of the deviation $\Delta L_t$ of the instantaneous broadband loudness level from the average dialog level in the entire audio signal 211. The latter parameter is typically part of the metadata of the audio signal 211, which is provided in the bitstream 112.

For determining the operating point 331, the block average (BA) power value in time direction over the entire input data block (spreading across N time slots, n=1, 2, . . . , N) may be determined. For simplicity, the channel index l is omitted in the following. The BA power value may be determined as $$P_i^{BA} = \frac{1}{N}\sum_n P_{in}.$$

This yields the in-band BA values $P_i^{BA}$ for the different DRC bands i, i=1, 2, . . . , Q. These BA values $P_i^{BA}$ may be converted to the corresponding loudness values in decibels $L_i^{BA}$ using Steven's power law and the common logarithm (to base 10), as outlined above for the units 302 and 303. The converted BA-values may be exponentially smoothed to form the short-term averages (STAs), $$L_{i,t}^{STA} = \beta L_{i,t}^{BA} + (1-\beta) \cdot L_{i,t-1}^{STA}.$$

In addition, the STAs may be smoothed to yield the long-term averages (LTAs), $$L_{i,t}^{LTA} = \gamma L_{i,t}^{STA} + (1-\gamma) \cdot L_{i,t-1}^{LTA}.$$

wherein t is the time index which indicates successive input data blocks. Hence, short-term averages (STAs) and long-term averages (LTAs) of the in-band BA values $P_i^{BA}$ may be determined for successive data blocks or frames.

The LTAs $L_{i,t}^{LTA}$ to may represent the in-band instantaneous loudness level $L_{i,t}^{dB}$ (of the data block at time instant t). The instantaneous broadband loudness level $L_t^{dB}$ (across all DRC bands) may be derived from the narrowband LTAs by converting the LTAs to power values, $$p_{i,t}^{LTA} = 10^{L_{i,t}^{dB}/6.7},$$

summing them up over all DRC bands, $$P_t^{LTA} = \sum_i P_{i,t}^{LTA},$$

and converting the sum to the corresponding loudness value in decibels (i.e. in the log-domain):

$$L_t^{dB} = 6.7 \log_{10} P_t^{LTA}.$$

The instantaneous deviation of the loudness level Lf from a reference level (e.g. dialnorm) may then be determined as the difference $$\Delta L_t = \text{dialnorm} - L_t^{dB}.$$

The operating points $O_{in}$ 331 in the different DRC bands i, i=1, 2, . . . , Q, may be computed by shifting the narrowband loudness levels $L_{i,t}^{dB}$ by the deviation $\Delta L_t$ in proportion to the distribution of the broadband power across the different DRC bands:

$$O_{in} = L_{i,t}^{dB} + \Delta L_t \cdot \frac{P_{i,t}^{LTA}}{P_t^{LTA}},$$

for all time slots n in the $t^{th}$ block of input data. The operating points 331 may therefore be considered as the in-band counterparts of the average dialog level in the audio signal 211.

Both, the STA and the LTA typically require an initial value for initialization at time t=0. In an example, the values $L_{i,0}^{STA}$ and $L_{i,0}^{LTA}$ may be initialized with the BA value $L_{i,1}^{BA}$ at start-up (i.e. at time t=1).

The running STA and LTA values may be reset to the instantaneous BA values $L_{i,t}^{BA}$, whenever the absolute difference between any of the current LTA values (at time instant t) to and the previous LTA values (at time instant t−1) in decibels exceeds a predetermined threshold (e.g. a threshold of 10 decibels). This enables the DRC to respond quickly to abrupt scene changes. The respective DRC gains may be set to zero, whenever a scene change is detected.

As indicated above, decimation in time in the QMF or subband domain may be used to reduce the computational complexity for DRC. Alternatively, or in addition, the application of DRC may be limited to a certain frequency, e.g. 16 kHz. In particular, the number of QMF bands in the highest DRC band may be reduced using an upper cutoff frequency which is lower than the Nyquist frequency. By way of example, only $K_{max}$<K subbands may be considered. This may reduce the number of MAC (multiply-accumulate) operations in the loudness detector unit 302.

The power values in each of the DRC bands i, i=1, 2, . . . , Q, are typically accessed at multiple occasions. The power values may be computed once and stored, and may then be reused via a lookup operation, whenever needed.

In order to further reduce computational complexity, channel linking may be performed at an early stage (e.g., in the loudness detector unit 302). By way of example, it may be decided based on the power values in the different channels (for each DRC band i, i=1, 2, . . . , Q) which channel is to be maintained for determining the joint control gain 329 for all the channels of the audio signal 211. By doing this, the computational complexity may be reduced.

In the present document, the use of Steven's power law is proposed to approximate loudness. Alternative means for approximating loudness may be used instead, e.g. A- or K-weighting. However, in view of computational complexity the use of Stevens's power law is preferable, as it may be implemented in an efficient manner, notably in conjunction with the lin2 log operation (i.e. in conjunction with the above-mentioned conversion from the linear domain to the logarithmic domain, e.g. using the operation 20 $\log_{10}(\cdot)$).

Figure 4:
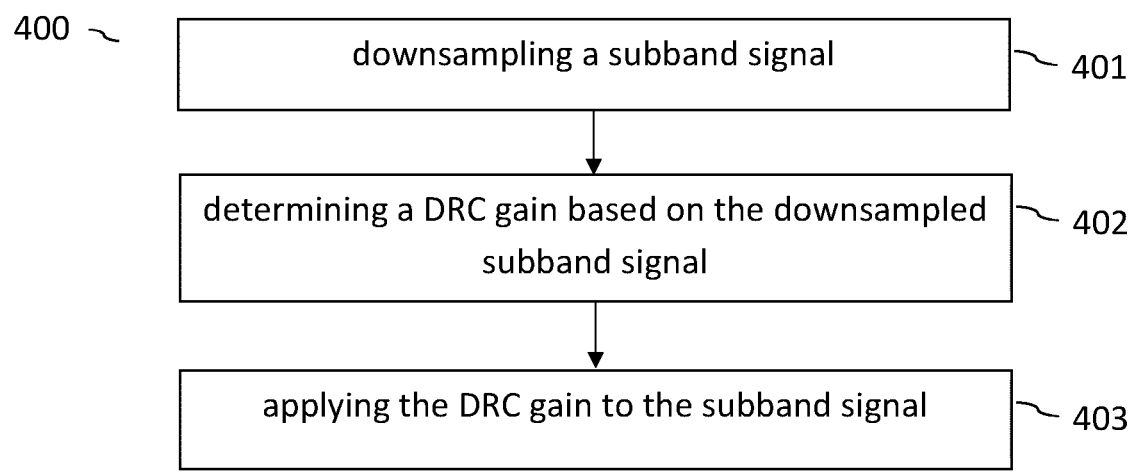
FIG. 4 shows a flow chart of an example method for applying DRC to an audio signal.

FIG. 4 shows a flow chart of an example (possibly computer-implemented) method 400 for applying dynamic range control or dynamic range compression (DRC) to an audio signal 211. The audio signal 211 may comprise a plurality of channels l, l=1, 2, . . . , L, with L 2. In other words, the audio signal 211 may be a multi-channel audio signal.

The method 400 comprises downsampling 401 a subband signal 212 derived from the audio signal 211, to provide a downsampled subband signal 321. Downsampling 401 may be performed by a downsampling factor M as outlined in the present document. The method 400 may be performed at a decoding unit 120 which is configured to decode a bitstream 112 wherein the bitstream 112 is indicative of the audio signal 211. The one or more subband signals 212 may be derived from the audio signal 211 using a time-to-frequency (forward) transform or an analysis filter bank, such as an analysis pseudo-QMF bank. In other words, the method 400 may comprise applying a forward transform or an analysis filter bank to the audio signal 211 to determine one or more, notably K, subband signals 212.

As such, K subband signals 212 for K different subbands or frequency bins may be provided, wherein the K subband signals 212 may be recombined using a time-to-frequency inverse transform or a synthesis filter bank (e.g. a synthesis pseudo-QMF bank) to provide the audio signal 211.

Downsampling 401 of the one or more subband signals 212 may be performed in an efficient manner, by selecting only every $M^{th}$ sample from the respective subband signal 212 to provide the corresponding downsampled subband signal 321.

The method 400 further comprises determining 402 a DRC gain 329 based on the downsampled subband signal 321. The DRC gain 319 (also referred to herein as the control gain) may be determined using the scheme outlined in the context of FIG. 3.

In addition, the method 400 comprises applying 403 the DRC gain 329 to the subband signal 212, to provide a dynamic-range compressed subband signal 213 of a dynamic-range compressed audio signal 214. Hence, the DRC gain 329, which has been determined using the downsampled subband signal 321, may be applied to the subband signal 212 (with the original resolution). As a result of this, DRC may be performed in an efficient manner without degrading the sound quality.

As already indicated above, the term "compressed" refers to "dynamic range compressed" in the present document. This term is to be distinguished from the term "coded", which may involve a data or bit-rate compression operation (for reducing the transmission rate of an audio signal).

Hence, a dynamic range control unit 210 configured to apply dynamic range control (DRC) to an audio signal 211 is described. The DRC unit 210 may comprise one or more of the units described in the context of FIG. 3. The DRC unit 210 may be part of or may work in conjunction with a decoding unit 120.

The DRC unit 210 may be configured to downsample a subband signal 212 derived from the audio signal 211, to provide a downsampled subband signal 321. Downsampling may be performed using the downsampling unit 301 described in the context of FIG. 3. Typically, the audio signal 211 is represented using K subband signals 212 for K frequency bins. Downsampling may be performed for some or all the K subband signals 212, notably for $K_{max}$ subband signals, with $K_{max}$<K. Downsampling may be performed using a (integer) downsampling factor M, such that a downsampled subband signal 321 comprises N/M samples, compared to the corresponding subband signal 212 which comprises N samples.

In particular, a frame or block of the subband signal 212 may comprise N samples corresponding to N time slots, and a corresponding frame or block of the downsampled subband signal 321 may comprise N/M samples for N/M time slots, with M>1 being a downsampling factor.

The DRC unit 210 may be configured to downsample the subband signal 212 without making use of a filter, notably a lowpass filter. In particular, the DRC unit 210 may be configured to determine the downsampled subband signal 321 by selecting every $M^{th}$ sample of the subband signal 212 as a sample of the downsampled subband signal 321. By doing this, the downsampling operation may be performed in a particularly efficient manner (which is possible because the one or more downsampled subband signals 321 are only used for determining the DRC gains 329).

The DRC unit 210 is further configured to determine a DRC gain 329 based on the downsampled subband signal 321. In particular, a sequence of N/M DRC gains 329 may be determined for the N/M samples of the downsampled subband signal 321. In other words, the DRC unit 210 may be configured to determine N/M DRC gains 329 for the corresponding N/M time slots of the downsampled subband signal 321, based on the downsampled subband signal 321. The DRC gains 329 may correspond to the control gains $c_{in}$ described in the context of FIG. 3.

In addition, the DRC unit 210 is configured to apply the DRC gain 329 to the subband signal 212, to provide a compressed subband signal 213 of a compressed audio signal 214. For this purpose, the DRC unit 210 may be configured to upsample the N/M DRC gains 329 to N DRC gains 329 for the corresponding N samples and/or time slots of the subband signal 212. The upsampling may be performed in an efficient manner by repeatedly using the same DRC gain 329 for M subsequent time slots. Alternatively, the upsampling may be performed by interpolating between two successive DRC gains 329 from the N/M DRC gains 329 to determine M−1 DRC gains 329 for M−1 subsequent time slots between the two successive DRC gains 329 from the N/M DRC gains 329. In other words, an interpolation scheme may be used between successive (downsampled) DRC gains 329, in order to determine the intermediate (upsampled) DRC gains 329. By way of example, linear interpolation or some other form of interpolation, notably a second or higher order interpolation, may be used. However, it should be noted that upsampling using a higher order interpolation may result in increased complexity and/or latency compared to using zero-order interpolation (e.g., repeatedly using the same DRC gain 329 for M subsequent time slots).

Subsequent to upsampling, the DRC unit 210 may be configured to multiply the N samples for the corresponding N time slots of the subband signal 212 with the corresponding N DRC gains 329 (in the linear domain) to determine the compressed subband signal 213.

Hence DRC may be performed in the subband domain in a computationally efficient to manner and preserving high perceptual quality.

As indicated above, the audio signal 211 may be represented using K subband signals 212 for K different frequency bins, with K>1 (K=20 or more, or K=50 or more, notably K=64).

The DRC unit 210 may be configured to group at least some of the K different frequency bins into Q DRC bands, with Q<K, notably Q<<K (e.g. Q>1 and/or Q<64, e.g. Q=4). Hence, Q DRC bands may be formed by assigning at least some or all the downsampled subbands signals 312 to different DRC bands. The DRC unit 210 may be further configured to determine a DRC gain 329 for at least one of the Q DRC bands, based on the subband signals 212 assigned to the at least one of the Q DRC bands, respectively. In particular, dedicated DRC gains 329 may be determined for the Q different DRC bands. On the other hand, the same DRC gain may be used for the subband signals 212 that have been assigned to a joint DRC band. By forming different DRC bands for determining joint DRC gains 329 for the different subband signals 212 of the respective DRC bands, the computational complexity can be further reduced.

The DRC unit 210 may be configured to ignore one or more of the K frequency bins, notably the one or more frequency bins corresponding to the highest frequencies of the K frequency bins and/or corresponding to the lowest frequencies of the K frequency bins (notably the lowest or DC frequency bin), when determining the DRC gain 329 for the Q DRC bands. In other words, some of the subband signals 212 (notably the subband signals 212 for the frequency bins k>$K_{max}$) may be ignored, when determining the DRC gains 329. By doing this, the computational complexity can be further reduced.

The DRC unit 210 may be configured to determine a loudness estimate 323 for a sample of the downsampled subband signal 321. Example loudness estimates 323 are $L_{inl}$ (in the linear domain) or $L_{inl}^{dB}$ (in the logarithmic domain), as outlined in the context of FIG. 3. A loudness estimate 323 may be determined for each time slot or sample n, for each DRC band i and/or for each channel l of a downsampled subband signal 321.

For determining the loudness estimate 323 for a sample of the plurality of downsampled to subband signals 321 which are regrouped into or assigned to a DRC band, the power or magnitude of the corresponding samples of the plurality of downsampled subband signals 321 may be summed up.

The DRC unit 210 may be configured to determine the gain value 329 for a sample of the downsampled subband signal 321 based on the loudness estimate 323 for the sample of the downsampled subband signal 321. For this purpose, a compression curve may be used, which is configured to assign a gain value, referred to herein as a mapped gain value 324, to the loudness estimate 323 (or to a value derived from the loudness estimate 323). The compression curve may correspond to or may be the compression curve specified above (in the context of FIG. 3).

The DRC unit 210 may be configured to determine a magnitude of the sample of the downsampled subband signal 321 (or of corresponding samples of the plurality of downsampled subband signal 321 which are assigned to the same DRC band). The magnitude may be the value $I_{inl}$ described in the context of FIG. 3.

Furthermore, the DRC unit 210 may be configured to apply Steven's power law and possibly a conversion from the linear domain to the logarithmic domain to the magnitude of the sample of the downsampled subband signal 321 to determine the loudness estimate 323 for the sample of the downsampled subband signal 321. The use of Steven's power law allows the loudness estimate 323 to be determined in a computationally efficient manner.

The compression curve may be configured to provide a gain value 324, referred to herein as the mapped gain value, (e.g. the value $F_{inl}$ as outlined in the context of FIG. 3) in dependence of the deviation of the loudness estimate 323 from an operating point 331 (e.g. using the formula $F_{inl}=F(L_{inl}^{dB}-O_{inl})$)

The operating point 331 may be dependent on a dialnorm parameter or an average dialog level of dialog content within the audio signal 211 or an average power level of the audio signal 211. This parameter may be provided in the bitstream 112 of the audio signal 211. By taking into account an operating point 331 for applying the compression curve, which may vary along the time line, the impact of DRC on the perceived quality of the audio signal 211 may be further reduced.

The DRC unit 210 may be configured to determine an average block power value based on power values of a block (or frame) of samples of the downsampled subband signal 321 (e.g., the BA values $P_i^{BA}$ outlined in the context of FIG. 3). The operating point 331 for the block (or frame) of samples of the downsampled subband signal 321 may then be determined based on the average block power value.

In particular, the DRC unit 210 may be configured to determine a long-term average block power value for the block of samples of the downsampled subband signal 321 based on the average block power value for the block of samples of the downsampled subband signal 321 and a sequence of previous blocks of samples of the downsampled subband signal 321. In particular, the long-term average block power value $P_{i,t}^{LTA}$ may be determined as outlined in the context of FIG. 3. The long-term average block power may be reset, in case a scene change is detected within the audio signal 211 (notably in case of an abrupt change of the loudness estimate 323).

Furthermore, the DRC unit 210 may be configured to determine a power deviation $\Delta L_t$ of the long-term average block power value from the dialnorm parameter, e.g. using the formula $$\Delta L_t = \text{dialnorm} - L_t^{dB}.$$

The operating point 331 for a sample from the block of samples of the downsampled subband signal 321 may then be determined in a precise manner based on the power deviation, e.g. using the formula $$O_{in} = L_{i,t}^{dB} + \Delta L_t \cdot \frac{P_{i,t}^{LTA}}{P_t^{LTA}}.$$

As a result of this, the impact of DRC on the sound quality of the audio signal may be further reduced. In particular, by setting the operating point 331 for the different DRC bands as outlined above, the spectral composition of the audio signal may be maintained (i.e. an equalization effect may be reduced), even when performing DRC in the DRC bands.

The compression curve may be defined by profile data 215 (which may be provided with the bitstream 112). The profile data 215 may comprise or may indicate one or more gain values for achieving an upward compression and/or a downward compression. In particular, the profile data 215 may comprise or may be indicative of the gain values $G_{maxcut}$, $G_{sectioncut}$, $G_{sectionboost}$ and/or $G_{maxboost}$. Alternatively, or in addition, the profile data 215 may comprise or may be indicative of one or more loudness threshold values. The loudness threshold values may be used for specifying different loudness intervals of loudness estimates 323 for different segments of the compression curve. In particular, the profile data 215 may comprise or may be indicative of the thresholds $L_{maxcut}$, $L_{sectioncut}$, $L_{0high}$, $L_{sectionboost}$, $L_{0low}$, and/or $L_{maxboost}$. By providing parameters of the compression curve as profile data 215, DRC may be performed in an efficient and precise manner (notably at a decoding unit 120), practically without any noticeable increase of the bit rate of the coding system 100.

The DRC unit 210 may be configured to determine a mapped gain value 324 for a sample of the downsampled subband signal 321 for a current time slot based on a loudness estimate 323 of the loudness of the sample of the downsampled subband signal 321 for the current time slot (e.g. using the compression curve). Furthermore, the DRC unit 210 may be configured to perform gain smoothing of the gain values 324 for samples of the downsampled subband signal 321 for the current time slot and for one or more previous time slots, to determine a smoothed gain value 326 for the sample of the downsampled subband signal 321 for the current time slot. Gain smoothing may be performed as outlined in the context of the gain smoothing unit 306. In particular, gain smoothing may make use of a low pass filter. The smoothing factor α used for performing gain smoothing may depend on the whether the loudness estimate 323 is above or below the operating point 331 of the compression curve. Alternatively, or in addition, the smoothing factor may depend on whether the loudness estimate 323 at a current time slot n is above or below the smoothed gain value 326 at the previous time slot n−1 (e.g. as outlined in the context of FIG. 3). By doing this, the impact of DRC on the perceived quality of the audio signal 211 may be further reduced.

The DRC gain 329 for the sample of the downsampled subband signal 321 for the current time slot n may then be determined based on the smoothed gain value 326 for the sample of the downsampled subband signal 321 for the current time slot n. By making use of gain smoothing, the impact of DRC on the perceived quality of the audio signal 211 may be further reduced.

As outlined above, the DRC unit 210 may be configured to determine a DRC gain 329 for a sample of the downsampled subband signal 321. The DRC gain 329 for a particular sample of the downsampled subband signal 321 may be applied to a plurality of successive samples of the subband signal 212 to determine the compressed subband signal 213. In other words, the DRC gain 329 may be upsampled to the sample rate of the subband signal 212. Upsampling may be performed using a sample and hold approach. As a result, DRC may be performed in a computationally efficient manner.

The audio signal 211 may comprise a plurality of different channels. In other words, the audio signal 211 may be a multi-channel audio signal. The DRC unit 210 may be configured to determine a joint DRC gain 329 for the plurality of different channels or for one or more subgroups of channels. Example subgroups of channels for a 5.1 multi-channel audio signal 211 may be a first subgroup of channels {L, R, C} and a second subgroup of channels {Ls, Rs}. A joint DRC gain 329 may be determined separately for each of the subgroups of channels.

In particular, the DRC unit 210 may be configured to select one of the channels from the plurality of different channels (or from a subgroup of channels), notably based on a plurality of power values of samples of the corresponding plurality of different channels. By way of example, the channel which requires the highest degree of compression or which requires the lowest degree of compression may be selected. The DRC gain 329 for the selected channel may then be determined as the joint DRC gain 329 for the plurality of different channels. Hence, the DRC gain 329 may only be determined for a single channel, but may be used for a plurality of different channels. By doing this, the computational complexity may be reduced, while at the same time reducing the impact on the perceptual quality of the audio signal 211. In particular, the spatial image of the audio signal 211 may be maintained, i.e. the balance between the different channels of the audio signal 211 may be maintained.

The DRC unit 210 may be configured to determine and apply a plurality of DRC gains 329 to a corresponding plurality of subband signals 212 to provide a corresponding plurality of compressed subband signals 329. As outlined above, the joint DRC gains 329 may be determined for one or more DRC bands. The compressed audio signal 214 may be determined by applying an inverse transform or a synthesis filter bank (notably a synthesis pseudo-QMF bank) to the plurality of compressed subband signals 329. The inverse transform or synthesis filter bank is complementary inverse of the forward transform or analysis filter bank used for deriving the plurality of subband signals 212 from the audio signal 211. In particular, the pair of forward transform and inverse transform and/or the pair of analysis filter bank and synthesis filter bank may satisfy the perfect reconstruction criterion.

The DRC unit 210 may be configured to determine the DRC gain 329 for a sample of the (downsampled) subband signal 212, 321, in dependence of a reference level for the compressed subband signal 329. The reference level may be indicated in the bitstream 112 (e.g. as profile data 215). The reference level may be used to offset the (possibly smoothed) gain 324, 326 provided by the compression curve, in order to level the compressed audio signal 214 in accordance to the reference level. In particular, the offset B 332 may be applied (as outlined in the context of FIG. 3). As a result, the expected loudness level of the audio signal may be set to a desired value.

Furthermore, a decoding unit 120 is described, which is configured to derive a dynamic-range compressed audio signal 214 from a bitstream 112. The bitstream 112 may be indicative of an audio signal 211 or of a plurality of subband signals 212 of an audio signal 211. The decoding unit 120 comprises the DRC unit 210 which is described in the present document. The DRC unit 210 is configured to apply dynamic-range compression to the audio signal 211.

In the present document, schemes are described which allow DRC to be performed in a computationally efficient manner without degrading the sound quality.

The methods and systems described in the present document may be implemented as software, firmware and/or hardware. Certain components may e.g. be implemented as software running on a digital signal processor or microprocessor. Other components may e.g. be implemented as hardware and or as application-specific integrated circuits. The signals encountered in the described methods and systems may be stored on media such as random-access memory or optical storage media. They may be transferred via networks, such as radio networks, satellite networks, wireless networks or wireline networks, e.g. the Internet. Typical devices making use of the methods and systems described in the present document are portable electronic devices or other consumer equipment which are used to store and/or render audio signals.

The invention claimed is:

1. A dynamic range control, referred to as DRC, unit configured to apply DRC to an audio signal; wherein the DRC unit is configured to
    downsample a subband signal derived from the audio signal, to provide a downsampled subband signal;
    determine a DRC gain based on the downsampled subband signal; and
    apply the DRC gain to the subband signal, to provide a compressed subband signal of a compressed audio signal.

2. The DRC unit of claim 1, wherein
    a frame of the subband signal comprises N time slots and a corresponding frame of the downsampled subband signal comprises N/M time slots; and
    M>1 is a downsampling factor.

3. The DRC unit of claim 2, wherein the DRC unit is configured to
   determine N/M DRC gains for the corresponding N/M time slots of the downsampled subband signal, based on the downsampled subband signal; and
   upsample the N/M DRC gains to N DRC gains for the corresponding N time slots of the subband signal.

4. The DRC unit of claim 3, wherein the DRC unit is configured to multiply N samples for the corresponding N time slots of the subband signal with the corresponding N DRC gains to determine the compressed subband signal, and/or wherein upsampling comprises
   repeatedly using the same DRC gain for M subsequent time slots; or
   interpolating between two successive DRC gains from the N/M DRC gains to determine M−1 DRC gains for M−1 subsequent time slots between the two successive DRC gains from the N/M DRC gains.

5. The DRC unit of claim 1, wherein the DRC unit is configured to
   downsample the subband signal without making use of a lowpass filter; and/or
   downsampled subband signal by selecting every $M^{th}$ sample of the subband signal as a sample of the downsampled subband signal.

6. The DRC unit of claim 1, wherein
   the audio signal is represented using K subband signals for K different frequency bins, with K>1; and
   the DRC unit is configured to
      group at least some of the K different frequency bins into Q DRC bands, with Q<K; and
      determine a DRC gain for at least one of the Q DRC bands, based on the subband signals assigned to the at least one of the Q DRC bands, respectively.

7. The DRC unit of claim 6, wherein the DRC unit is configured to ignore one or more of the K frequency bins when determining the DRC gain for the Q DRC bands.

8. The DRC unit of claim 1, wherein the DRC unit is configured to
   determine a loudness estimate for a sample of the downsampled subband signal; and
   determine the gain value based on the loudness estimate using a compression curve.

9. The DRC unit of claim 8, wherein the compression curve is defined by one or more parameters comprised within profile data, and/or wherein the DRC unit is configured to
   determine a magnitude of the sample of the downsampled subband signal; and
   apply Steven's power law and a conversion from a linear-domain to a logarithmic-domain to the magnitude of the sample of the downsampled subband signal to determine the loudness estimate for the sample of the downsampled subband signal.

10. The DRC unit of claim 8, wherein
    the compression curve is configured to provide a mapped gain value in dependence of a deviation of the loudness estimate from an operating point; and
    the operating point is dependent on a dialnorm parameter or on an average dialog level of dialog content within the audio signal or on an average power level of the audio signal.

11. The DRC unit of claim 10, wherein the DRC unit is configured to
    determine an average block power value based on power values of a block of samples of the downsampled subband signal; and
    determine the operating point for the block of samples of the downsampled subband signal also based on the average block power value.

12. The DRC unit of claim 11, wherein the DRC unit is configured to
    determine a long-term average block power value for the block of samples of the downsampled subband signal based on the average block power value for the block of samples of the downsampled subband signal and a sequence of previous blocks of samples of the downsampled subband signal;
    determine a power deviation of the long-term average block power value from the dialnorm parameter; and
    determine the operating point for a sample from the block of samples of the downsampled subband signal based on the power deviation.

13. The DRC unit of claim 1, wherein the DRC unit is configured to
    determine a mapped gain value for a sample of the downsampled subband signal for a current time slot based on a loudness estimate of the loudness of the sample of the downsampled subband signal for the current time slot;
    perform gain smoothing of the mapped gain values for samples of the downsampled subband signal for the current time slot and for one or more previous time slots, to determine a smoothed gain value 326; for the sample of the downsampled subband signal for the current time slot; and
    determine the DRC gain for the sample of the downsampled subband signal for the current time slot based on the smoothed gain value for the sample of the downsampled subband signal for the current time slot.

14. The DRC unit of claim 1, wherein the DRC unit is configured to
    determine a DRC gain for a sample of the downsampled subband signal; and
    apply the DRC gain for the sample of the downsampled subband signal to a plurality of successive samples of the subband signal to determine the compressed subband signal.

15. The DRC unit of claim 1, wherein
    the audio signal comprises a plurality of different channels; and
    the DRC unit is configured to determine a joint DRC gain for the plurality of different channels or for one or more subgroups of the plurality of different channels.

16. The DRC unit of claim 15, wherein the DRC unit is configured to
    select one of the channels from the plurality of different channels; and
    determine a DRC gain for the selected channel as the joint DRC gain for the plurality of different channels or for the one or more subgroups of the plurality of different channels.

17. The DRC unit of claim 1, wherein the DRC unit is configured to
    determine and apply a plurality of DRC gains for a corresponding plurality of subband signals to provide a corresponding plurality of compressed subband signals; and
    determine the compressed audio signal by applying an inverse transform or a synthesis filter bank to the plurality of compressed subband signals; wherein the inverse transform or synthesis filter bank are complementary to a forward transform or analysis filter bank used for deriving the subband signal from the audio signal.

18. A decoding unit configured to derive a dynamic-range compressed audio signal from a bitstream indicative of an audio signal;
  wherein the decoding unit comprises the DRC unit according to claim 1, configured to apply dynamic range control to the audio signal.

19. A method for applying dynamic range control, referred to as DRC, to an audio signal; wherein the method comprises
  downsampling a subband signal derived from the audio signal, to provide a downsampled subband signal;
  determining a DRC gain based on the downsampled subband signal; and
  applying the DRC gain to the subband signal, to provide a compressed subband signal of a compressed audio signal.

20. A non-transitory computer-readable storage medium comprising instructions which, when executed by a processor cause the processor to perform the method of claim 19.

* * * * *